United States Patent [19]

Fling

[11] Patent Number: 4,727,506

[45] Date of Patent: Feb. 23, 1988

[54] DIGITAL SCALING CIRCUITRY WITH TRUNCATION OFFSET COMPENSATION

[75] Inventor: Russell T. Fling, Fishers, Ind.

[73] Assignee: RCA Corporation, Princeton, N.J.

[21] Appl. No.: 715,405

[22] Filed: Mar. 25, 1985

[51] Int. Cl.$^4$ .............................................. G06F 7/38
[52] U.S. Cl. .................................. 364/745; 364/724; 364/715; 375/26
[58] Field of Search .................. 364/745, 724; 358/11, 358/13; 375/25, 26, 31, 33; 328/167

[56] References Cited

U.S. PATENT DOCUMENTS

| | | | |
|---|---|---|---|
| 4,183,016 | 1/1980 | Sawagata | 340/347 |
| 4,195,350 | 3/1980 | Moore | 364/724 |
| 4,229,800 | 10/1980 | Gregorian et al. | 364/745 |
| 4,236,224 | 11/1980 | Chang | 364/724 |
| 4,240,106 | 12/1980 | Michael | 358/36 |
| 4,275,411 | 6/1981 | Lippel | 358/13 |
| 4,337,518 | 6/1982 | Ohnishi | 364/724 |
| 4,367,536 | 1/1983 | Vignes et al. | 364/745 |
| 4,468,790 | 8/1984 | Höfelt | 375/33 |
| 4,485,403 | 11/1984 | Illetschko | 358/167 |
| 4,494,214 | 1/1985 | Bernard et al. | 364/724 |
| 4,524,447 | 6/1985 | Willis et al. | 375/26 |
| 4,594,726 | 6/1986 | Willis | 375/26 |

OTHER PUBLICATIONS

B. Gold and C. M. Rader, *Digital Processing of Signals*, McGraw-Hill Book Co. N.Y., 1969, pp. 98–131.

*Primary Examiner*—Emanuel S. Kemeny
*Assistant Examiner*—Tan V. Mai
*Attorney, Agent, or Firm*—E. M. Whitacre; P. J. Rasmussen; E. P. Herrmann

[57] ABSTRACT

A scaling circuit for scaling PCM signals by factors less than one includes a bit-shift and truncating circuit. Roundoff error compensating circuitry adds an offset value to the samples to be scaled by the bit-shift circuitry to compensate for errors produced by truncation without rounding. The offset values are dithered to increase the apparent resolution of the system.

10 Claims, 7 Drawing Figures

DIGITAL SCALING CIRCUITRY WITH TRUNCATION OFFSET COMPENSATION

This invention relates to circuitry for compensating for the effects of quantization and truncation/rounding errors in digital signal processing systems.

BACKGROUND OF THE INVENTION

The invention will be described in the environment of a recursive filter in a video signal processing system, however, it is to be understood that it is not limited to such applications.

In video systems recursive filters may be used to reduce noise in the frequency band of the video signal. From frame-to-frame there is a relatively high degree of signal correlation. Thus, if a video signal from successive frames is summed, the correlated video signal will add linearly, but random noise accompanying the signal will not. The summed signal is generally normalized to a desired amplitude range and the signal-to-noise ratio of the averaged signal is enhanced by the processing.

A typical video recursive filter includes a delay device coupled in a recirculating loop with circuitry for combining a fraction of delayed signal with a fraction of incoming signal. The combined signal is applied to the delay device which delays the combined signal by the time period necessary to insure that constituent parts of each combined video signal samples are from corresponding pixels of successive video frames. The fractional parts of the incoming and delayed signals are obtained by scaling the two signals by factors K and (1-K) respectively. If the amplitude of the incoming signal is equal to the amplitude of the averaged signal from the delay device, the new combined signal will be normalized to equal the input signal. In a digital processing system, the normalization tends to minimize the sample bit size required of the delay device. Thus, if the incoming signal consists of 8-bit samples, the sample size in the delay device can be held to e.g. 9 or 10 bits. This is an important design aspect in reducing the manufacturing costs of recursive filters for consumer applications.

Scaling circuits for use in recursive filters in e.g. consumer television receivers are required to be of relatively simple construction to be cost competitive. One of the simplest scaling circuits and, thus, one which is desirable for use in a digital television receiver, is a bit-shifter. The bit-shifter, or barrel shifter, shifts the bits of a sample rightward to less significant bit positions to perform division and shifts sample bits leftward to more significant bit positions to perform multiplication. In the divide mode, which mode is appropriate to effect scaling by factors less than one, after the sample bits are right shifted, the shifted sample is truncated by discarding a number of least significant bits equal in number to the number of significant bit positions the sample bits were shifted. Truncation without e.g. rounding and truncation with improper rounding will tend to generate significant anomalies in the processed signal. See B. Gold and C. M. Rader, *Digital Processing Of Signals*, McGraw Hill, 1969, pp. 98–131. In the context of a video signal processing system the truncation/rounding effects of a recursive filter may be manifested as the "ground glass" effect. This is the result of samples applied to the recursive filter having insufficient resolution to permit the filter to converge to the proper values.

Scaling by bit-shifting and truncation is illustrated in Table I.

TABLE I

| Binary Input Value | Decimal Equiv. | Right Shift 3 Bit Pos. | Binary Truncated Value | Decimal Equiv. | Desired Decimal Equiv. |
|---|---|---|---|---|---|
| 111.000 | 7 | 000.111 | 000 | 0 | 1 |
| 110.000 | 6 | 000.110 | 000 | 0 | 1 |
| 101.000 | 5 | 000.101 | 000 | 0 | 1 |
| 100.000 | 4 | 000.100 | 000 | 0 | 1 |
| 011.000 | 3 | 000.011 | 000 | 0 | 0 |
| 010.000 | 2 | 000.010 | 000 | 0 | 0 |
| 001.000 | 1 | 000.001 | 000 | 0 | 0 |
| 000.000 | 0 | 000.000 | 000 | 0 | 0 |

For illustrative purposes a three bit binary input signal is utilized. All possible three bit binary input values are listed in the leftmost column labelled Binary Input Value and their decimal equivalents are listed in the second column labelled Decimal Equiv. The three-bit input values are written with a decimal point and three trailing zeroes for the pupose of indicating the significance of the bit positions. The third column labelled Right Shift 3 Bit Pos., lists binary values corresponding to the values in the first column which have been right shifted three significant bit positions, i.e. the column one values divided by 8. Typically a scaling circuit will truncate or drop off the trailing bits and the resulting binary values are listed under the column labelled Binary Truncated Value and their corresponding decimal equivalents are shown to the right thereof under the column labelled Decimal Equiv. It is seen that all the right shifted and truncated values have a decimal value of zero. The rightmost column labelled Desired Decimal Equiv. indicates the values that would be produced if the truncated values were properly rounded. The values in this column are determined by assuming that all values having dropped bits, which are equal to or greater than one-half the least significant bit of the truncated value, should have the least significant bit of the truncated value raised by one unit.

J. K. Moore in U.S. Pat. No. 4,195,350 entitled "Method And Apparatus For Eliminating Deadband In Digital Recursive Filters" discloses a method and apparatus for reducing the effects of truncating scaled samples in a recursive filter. In this system samples are scaled by bit shifting. Then the absolute value of the scaled sample is truncated by dropping a number of least significant digits determined by the value of the scale factor. If any of the dropped bits is a logic "one" value, the value of the truncated sample is incremented by one unit. The incremented, truncated sample is then complemented or not depending on whether the scaled sample was negative or positive respectively.

U.S Pat. No. 4,236,224 entitled "Low Roundoff Noise Digital Filter" issued to T. L. Chang describes recursive filters wherein the sample sums from the combining means are truncated by dropping a number of least significant bits. The effect of truncation is reduced by scaling the dropped or roundoff bits, delaying and subtractively combining the scaled roundoff bits with the incoming signal and the delayed combined signal samples.

The foregoing systems tend to reduce anomalies produced by sample truncation, however, the corrections applied are constrained to the quantization value of the processed samples. In accordance with an aspect of the present invention truncation errors are reduced by introducing correction factors with effective higher resolution than the quantization value of the processed samples.

SUMMARY OF THE INVENTION

The present invention is a scaling circuit for scaling binary samples by a factor of one or less. The scaling circuit includes a bit shifter for right shifting applied samples by N significant bit positions to scale the applied samples by a factor of $\frac{1}{2}^N$ (where N is an integer), and truncating the N least significant bits of the bit-shifted samples. An adder is serially coupled to the input of the bit-shifter. Binary values are coupled to the adder to precondition the samples to be scaled so that the bit-shifted and truncated samples are rounded to the nearest whole value of the least significant bit of the truncated samples.

DETAILED DESCRIPTION

In the figures, broad arrows interconnecting circuit elements represent multiconductor connections for passing parallel-bit samples. Narrow arrows interconnecting circuit elements represent single conductor connections for serial bit digital samples or analog signals.

Figure 1:
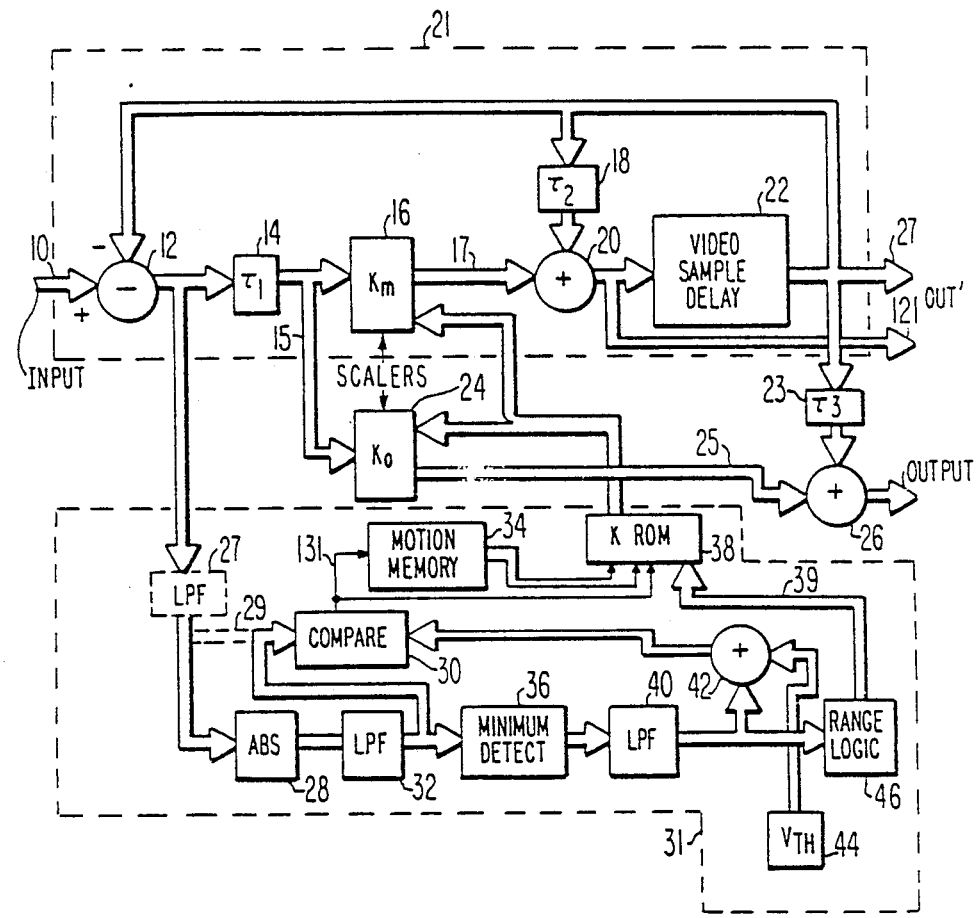
FIG. 1 is a block diagram of a recursive filter employing scaling circuitry embodying the present invention, which recursive filter is arranged to perform noise reduction and separation of the luminance component from composite video signal.

FIG. 1 is a motion/noise adaptive recursive filter for processing video signals. The circuitry circumscribed by the dashed line boxes 21 and 31 defines the more general system. The entire circuitry shown in FIG. 1 is directed toward the more specific application of separating a luminance component from composite video signal.

The circuitry circumscribed in the dashed box 21 is a recursive filter of the type generally described in U.S. Pat. No. 4,485,403, and is adaptive by virtue of the capability to change the scale factor $K_m$ of scaling circuit 16. Noise reduced video signal is available at the output connection, 27, of the video sample delay element 22. Alternatively noise reduced video signal may be taken from the input connection 121 of the video sample delay element 22.

Briefly, circuit 21 operates as follows. Video signal samples, $V_x$, to be processed are applied from input port 10 to a subtracter 12. Delayed samples $V_{DY}$ from delay element 22 are coupled to a second input port of subtracter 12 which develops the difference samples $(V_x - V_{DY})$. The difference samples are coupled via compensation delay element 14 to the input of scaling circuit 16. Scaling circuit 16 develops scaled difference sample values $K_m(V_x - V_{DY})$ which are coupled to an input port of adder 20. Delayed samples $V_{DY}$ from delay element 22 are coupled via compensation delay element 18 to a second input port of adder 20 which develops the sample sums $V_Y$ given by $$V_Y = V_{DY} + K_m(V_x - V_{DY}) \tag{1}$$

$$= K_m V_x + (1 - K_m) V_{DY}.$$

The delay element 22 and the compensation delay elements 14 and 18 are designed so that the samples represented by $V_x$ and $V_{DY}$ correspond to like pixels of succeeding frames. Compensation delay element 14 is required to afford circuitry 31 time to develop scale factors $K_m$, for scaling circuit 16 on a pixel-by-pixel basis, i.e. a sample-by-sample basis. Compensation delay element 18 is provided to accomodate the delay introduced by both the compensation delay element 14 and the scaling circuit 16.

The samples $V_{DY}$ correspond to the samples $V_y$ delayed by one video frame period. Assuming the system 21 is in the steady state and there is no interframe image motion and expanding equation (1) by substituting $V_y$, for $V_{DY}$ with the appropriate time shift and simplifying, it can be shown that the signal component, $V_{SY}$, of samples $V_Y$ equal the signal component, $V_{SX}$, of the input samples $V_x$. The noise component $V_{NY}$ of the samples $V_Y$ is reduced by the factor $\sqrt{K_m/(2-K_m)}$. These results assume that the signal component $V_{SX}$ is in component video form, i.e. either luminance or chrominance signal. However, if the signal component $V_{SX}$ is a chrominance component or composite video including a chrominance component, provision must be made to invert the phase of the chrominance component before it is fed back from the delay element 22 to elements 12 and 20. Such chrominance component phase inversion is known in the art of video signal recursive filters.

Assuming that the input signal is a composite video signal and no provision is made for chrominance phase inversion. The samples $V_{SY}$ will have a luminance component $V_{LY}$ and a chrominance component $V_{CY}$. In the absence of interframe image motion, the luminance component $V_{LY}$ will converge to a value which is equal in amplitude to the amplitude of the input luminance component $V_{LX}$. The chrominance component $V_{CY}$ in the absence of motion will tend to converge to the value given by $$V_{CY} = V_{CX} K_m / (2 - K_m). \tag{2}$$

The value of the scale factor $K_m$ is determined on a pixel-by-pixel basis according to the history of interframe image motion for each pixel. If motion exists between the current frame and the preceding frame the scale factor $K_m$, may be, set to a value of one in order not to incur a signal bandwidth reduction. When interframe image motion ceases the scale factor $K_m$ is established at a value or a sequence of values less than one, which values are determined by the time desired for the system to converge to the steady state and the desired amount of noise reduction. For an example of a recursive filter which determines the scale factors as a function of both motion history and the amplitude of frame-to-frame image differences see U.S. Pat. No. 4,240,106 entitled "Video Noise Reduction".

The circuitry circumscribed by the dashed box 31 generates the appropriate sequences of scale factors for the scaling circuits on a pixel-by-pixel basis. The scale factors or control signals corresponding to scale factors are programmed in a read only memory (ROM 38). ROM 38 produces the scale factors on its output bus responsive to signals indicative of image motion and noise applied as address codewords to its address input port. The address codewords are supplied from range logic 46, comparator 30 and motion memory 34.

Circuitry 31 is responsive to the sample differences from subtractor 12. The luminance components of input samples $V_x$ and delayed samples $V_{DY}$ cancel in subtracter 12 when there is no motion and will produce sample differences when image changes occur from frame-to-frame. These luminance sample differences indicate motion. If the input signal $V_x$ contains a chrominance component e.g. the input signal is composite video signal, the chrominance component of $V_{DY}$ will be 180 degrees out of phase with the chrominance component of input samples $V_x$, and they will add constructively in subtracter 12 even when there is no motion. In order to detect motion from the sample differences the chrominance component must first be removed from the sample differences. This is accomplished by the low-pass filter 27 which has a pass-band designed to attenuate the frequency spectrum occupied by chrominance signals. The luminance component of the sample differences from low-pass filter 27 is applied to the absolute value circuit 28 which converts all of the luminance sample differences to a single polarity, e.g. positive. These samples are applied to a second low-pass filter 32 which smooths the output of the absolute value circuit.

Output samples from low-pass filter 32 are applied to one input of the comparator 30 which compares them to a reference value from adder 42. If the samples from low-pass filter 32 exceed the reference value, comparator 30 provides a motion signal for the respective pixel sample, on output connection 131. Low-pass filter 32, smooths the sample differences from circuit 28, to preclude the comparator from developing a jittering motion signal for successive samples.

The motion - no motion signals from comparator 30 are applied to a motion memory 34 which delays them by one or more frame periods. The motion - no motion signals and delayed motion - no motion signals from comparator 30 and motion memory 34 are coupled as partial address codewords to ROM 38 which outputs the desired sequences of scale factors for scaling the respective circuits on a pixel-by-pixel basis. Table II shows exemplary scale factors output by ROM 38 for the possible combinations of current and delayed motion - no motion signals. A "1" indicates motion has been detected and a "0" indicates no motion has been detected. In Table II it is presumed that the motion signal is delayed by two frame periods and that signals delayed by one and two frame periods are available from motion memory 34.

TABLE II

| Motion Signal | Delayed 1 Frame | Delayed 2 Frames | $K_m$ |
|---|---|---|---|
| 1 | 1 | 1 | 1 |
| 1 | 1 | 0 | 1 |

TABLE II-continued

| Motion Signal | Delayed 1 Frame | Delayed 2 Frames | $K_m$ |
|---|---|---|---|
| 1 | 0 | 1 | 1 |
| 1 | 0 | 0 | 1 |
| 0 | 1 | 1 | $\frac{1}{2}$ |
| 0 | 1 | 0 | $\frac{1}{2}$ |
| 0 | 0 | 1 | $\frac{1}{4}$ |
| 0 | 0 | 0 | $\frac{1}{8}$ |

Element 36 coupled to low-pass filter 32 detects the smallest image sample difference in each field or frame of video signal. The amplitude of this sample is presumed to be a measure of the noise in the video signal. The minimum differences from detector 36 are smoothed in low-pass filter 40 which is a digital filter clocked at the field or frame rate. The output of low-pass filter 40 is applied as one input to adder 42 and provides the base line for the reference values coupled to comparator 30. Onto this baseline is added a motion threshold value $V_{TH}$ supplied by source 44. The motion reference value coupled to comparator 30 is therefore noise dependent.

The noise related signal from low-pass filer 40 is also coupled to the address input of a range logic circuit 46. Range logic circuit 46 which may consist of a priority encoder or a read only memory, generates partial address codewords for ROM 38, which codewords correspond to amplitude ranges of the noise related signals applied to its input. For each successively larger range of noise related samples circuit 46 develops a codeword to condition ROM 38 to select a different set of scale factors. The selected set of scale factors will be used for the entire field or frame period to determine the scale factor sequences for each pixel according to the state of image motion involving each pixel.

If the difference samples indicate that the noise content of the input signal is relatively large, the scale factors $K_m$ produced by ROM 38 will in general be relatively small and vice versa. The set of scale factors $K_m$ listed in Table II correspond to a moderate range of signal noise. If the signal noise falls into a smaller noise range the programmed set of scale factor values for this range may be 1, 1, 1, 1, $\frac{1}{2}$, $\frac{1}{2}$, $\frac{1}{4}$, $\frac{1}{4}$ and if the signal noise falls into a larger range the set of scale factor values may be 1, 1, 1, 1, $\frac{1}{2}$, $\frac{1}{2}$, $\frac{1}{8}$, 1/32.

Figure 3:
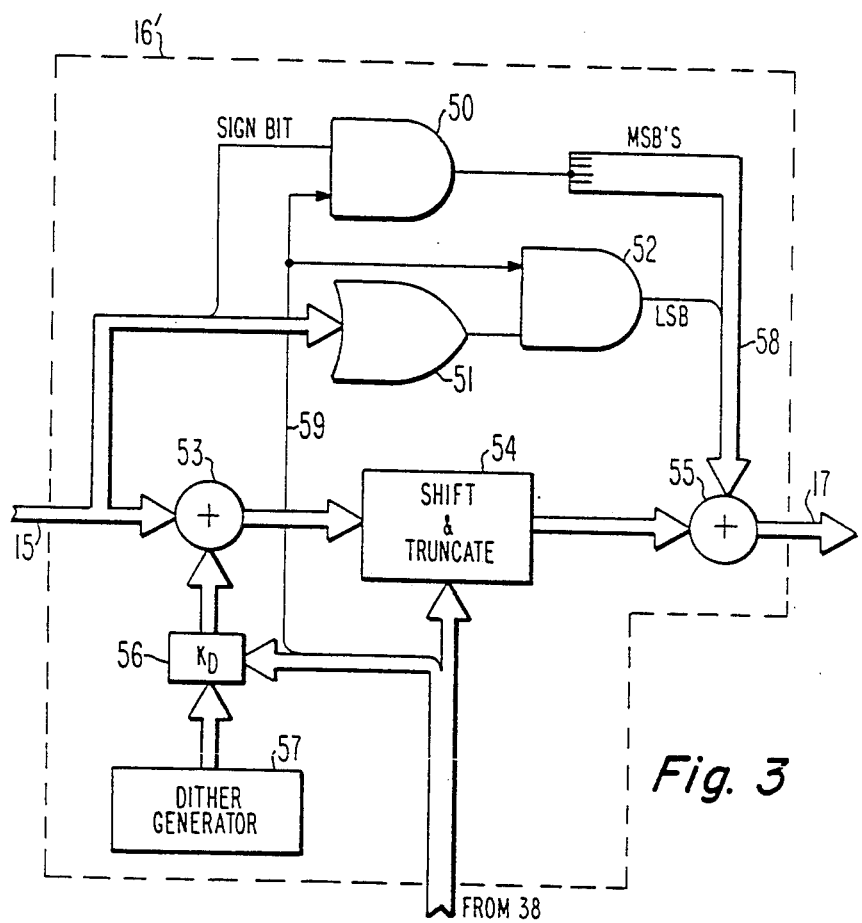
FIG. 3 is a block diagram of a further scaling circuit embodying the present invention, for use in the FIG. 1 circuitry.
Figure 5:
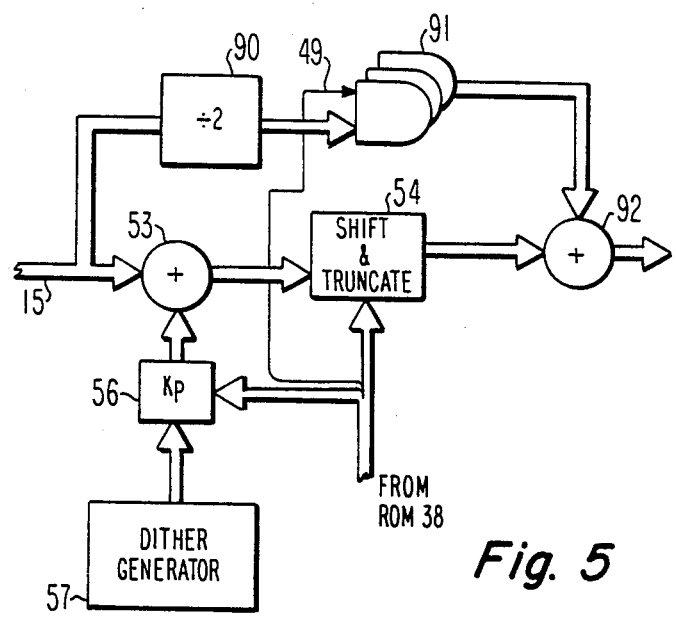
FIG. 5 is a block diagram of a still further scaling circuit embodying the present invention, which may be used in the FIG. 1 circuitry.

In addition to providing the sets of scale factors which are sequenced responsive to the motion signals, ROM 38 provides the control signals to connection 59 of the FIG. 3 scaling circuit and connection 49 of the FIG. 5 circuit. ROM 38 provides a "0" value on connection 59 when the address codewords from ROM 46 indicate that the current range of noise values is other than the smallest range, and a "1" value when the noise value is within the smallest noise range. The number of noise ranges will nominally be determined by user preference but it is anticipated that for most purposes three ranges will be sufficient. ROM 38 produces a logic one value on connection 49 (FIG. 5) for the first frames of no motion and zero values at other times.

Figure 2:
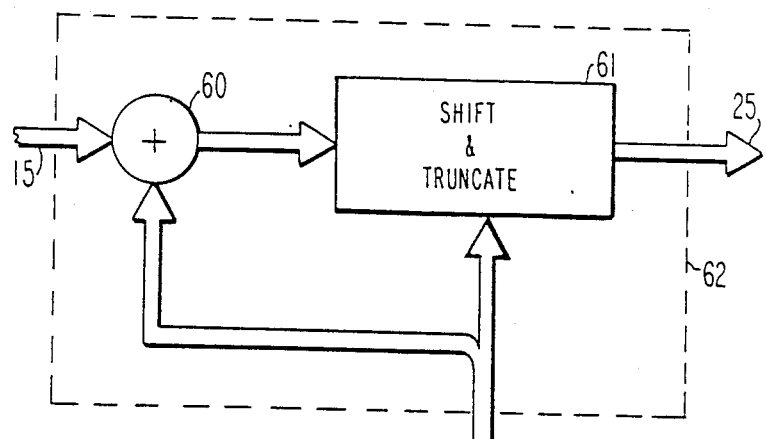
FIG. 2 is a block diagram of scaling circuit embodying the present invention, for use in the FIG. 1 circuitry.

Referring to FIG. 2, a scaling circuit 62, is shown which embodies the present invention and may be substituted for the scaling circuits 16 and 24 of the FIG. 1 system. Scaling circuit 62 consists of a bit-shift and truncate scaler, 61, e.g. a barrel shifter, and an adder, 60, coupled in series with its input port. Samples to be scaled are applied to one input port, 15, of the adder and scaled and rounded samples are produced at the output 25 of the bit-shifter. A value equal to 1/2K, supplied from the motion adaptive circuitry 31, is applied to the second input port of the adder 60 where K is the scale factor by which the scaling circuit alters the applied samples. A shift control signal corresponding to the scale factor K is applied to the bit-shifter from circuit 31.

Figure 4A:
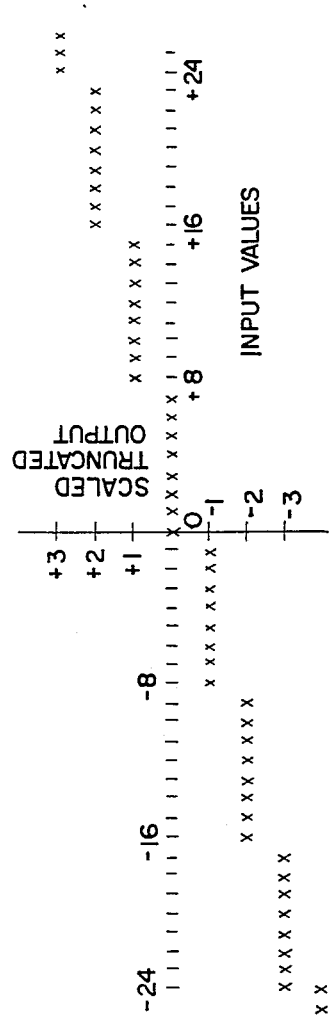
FIG. 4A is a graphical representation of the result of right shifting a binary value three significant positions and truncating the shifted value to the original most significant bit positions.

Referring to FIG. 4A, the graph illustrates the output produced by a bit-shift and truncate circuit in dividing respective input values by 8. The ordinate corresponds to the value in units of scaled and trucnated values, and the abscissa corresponds to input values in units. FIG. 4A corresponds in part to the values listed in Table I. It is apparent from the graph of FIG. 4A that the simple bit-shift and truncate function produces a result which is biased negatively. The adder 60 in the scaling circuit of FIG. 2, adds an amount to offset the input values that are applied to the bit-shift and truncate circuit, by an amount approximately equal to the bias introduced by the truncation. The amount added is equal to $2^{N-1}$ where N is the number of significant bit positions that the bits of a sample are shifted rightward to effect scaling.

Adding the values $2^{N-1}$ to the samples to be scaled may be seen to compensate for the truncation offset as follows. The input samples have values S. The samples applied to the bit-shift-and truncate circuit have values $(S+2^{N-1})$. The scaled values output by the bit-shift and truncate circuit have values $(S+2^{N-1})/2^N$ which is equal to $(KS+\frac{1}{2})$. This indicates that every value KS having a fractional part of $\frac{1}{2}$ or greater is elevated to the next highest whole number.

Figure 4B:
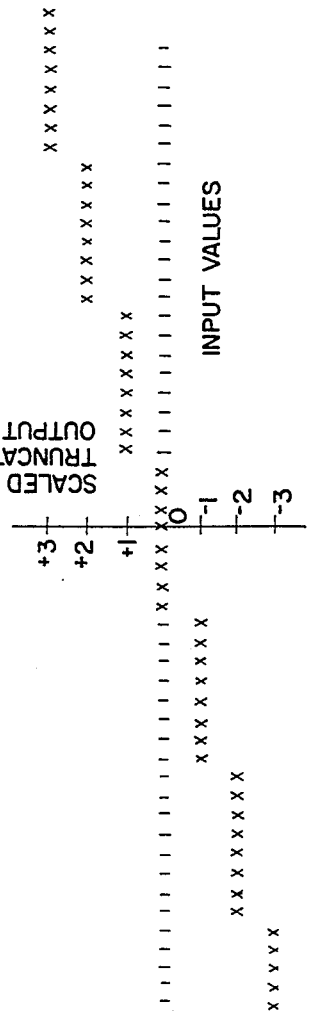
FIG. 4B is a graphical representation of the response of the scaling circuit of FIG. 2.

FIG. 4B illustrates the output values of the FIG. 2 scaling circuit where the bit-shift and truncate circuit is conditioned to scale applied samples by $\frac{1}{8}$ and a value of four units is added to the respective input values in adder 60. Each output level extends approximately halfway on either side of each multiple of the scale factor. This corresponds to, within a one-half least significant input bit value, a properly rounded, truncated scaled input value.

FIG. 3 illustrates the details of a scaling circuit 16′ which operates in accordance with the principles of the FIG. 2 scaling circuit but which provides more accurately rounded output values. The FIG. 3 circuit may be substituted for the scaling circuit 16 of FIG. 1. In FIG. 3, element 56 is a scaling circuit and may be of the type illustrated in FIG. 2. In addition, elements 53 and 54 correspond to a scaling circuit such as the one illustrated in FIG. 2 with the exception that the offset value applied to the adder 53 is a dithered value rather than a constant equal to $2^{N-1}$.

The recursive filter 21 of FIG. 1 tends to average the samples applied to the circuit. Therefore, the samples processed by the scaling circuit 16 will tend to be averaged. thus, if different offset compensation values are added to the scaling circuit (consisting of adder 53 and bit shift circuit 54) the truncated values output by the bit shifter will tend to be averaged.

Refer to FIG. 3 and in particular elements 53, 54, 56 and 57. Samples to be scaled from bus 15 are applied to one input port of adder 53, the output of which is coupled to the input port of bit-shift and truncate circuit 54. Bit shift control signals correpsonding to the requisite scale factor are applied to circuit 54 from the motion adaptive circuitry 31. Truncation offset compensation values are applied to a second input port of adder 53 from scaling circuit 56. Input values are applied to scaling circuit 56 from a dither signal generator 57. In the illustrated circuit, dither generator 57 randomly generates values from zero to 15, i.e. it produces sixteen four bit values. These values are scaled in circuit 56 by a scale factor equal to $1/(16 K_m)$ where $K_m$ is the current scale factor by which samples applied to input 15 are to be scaled. More generally the scale factor, $K_D$, applied to scaling circuit 56 is equal to $1/(K_m$ times $2^R)$ where R is the number of bits in the binary values produced by the dither generator 57. The time average compensating value is $(2^{N-1} - 0.5)$.

As an example assume $K_m$ equals $\frac{1}{8}$ and R equals 4. Then the scale factor $K_D$ equals $\frac{1}{2}$. The offset compensation values applied to adder 53 from scaling circuit 56 will therefore range from zero to 7. If these values are generated randomly the average compensation value over time will equal 3.5. Note that this value has a higher effective resolution than the least significant bit of the applied values. As a result the scaled rounded and truncated values produced by circuit 54 will have a higher effective resolution than the resolution of the least significant bit output by circuit 54.

In relation to FIG. 4B, on the average, the output levels provided by the FIG. 3 circuit will tend to be shifted rightward by 0.5 input units which corresponds to a rounding to within one-quarter the input quantization level.

An alternative circuit for providing dithered offset compensation values to adder 53 consists of a further adder with its output connected to adder 53 and one input port connected to ROM 38. To the second input of this adder, a value of minus one unit is applied for alternate difference samples applied to bus 15. ROM 38 applies values equal to $1/(2K_m)$ to the other input of the adder. The offset compensation values coupled to adder 53 alternate between $1/(2K_m)$ and $(1/2K_m))-1$ the time average of which is $(2^{N-1} - 0.5)$.

The foregoing process applies if the scale tactor applied to the circuitry 16′ is held constant for a length of time sufficient to allow sample averaging. If the motion adaptive circuitry 31 applies a sequence of scale factors to the circuitry immediately after motion stops, in order to cause the recursive filter to converge rapidly, and each scale factor in the sequence is applied for only e.g. one or two frame periods until the steady state scale factor is applied, then during the application of the sequence of scale factors it may be desirable to apply alternate offset compensation values to adder 53. These alternate offset compensation values may all be selected to equal a zero value. The compensation value during this time is somewhat arbitrary because the system is not expected to converge during the sequencing of scale factors but only to tend toward convergence. To generate the zero valued offset compensation values the scale factor $K_D$ may be set to zero by the motion adaptive circuitry 31. Alternatively, respective offset compensation values equal to $1/2K_m$ for each scale factor $K_m$ of the sequence, may be multiplexed to the adder 53 from the motion adaptive circuit 31.

Scaling circuit 16′ includes additional circuit elements 50, 51, 52 and 55 to add the values +1, 0 and −1 to the scaled output values from the bit-shift and truncate circuit 54, when less noise reduction is required on the current signal. The values +1, 0 and −1 are added when the sample differences from subtractor 12 applied to the input of the scaling circuit 16′ are positive, zero and negative respectively. The effect of adding ±1 to the scaled output values is to lessen the effect of the scale factor, i.e. to increase the scale factor. The value of the scale factor modified in this manner is equivalent to the applied scale factor $K_m$ plus the reciprocal of the value of the current sample difference applied to the input of the scaling circuit.

A signal on connection 59 from the motion adaptive circuit 31 enables the circuit elements 50, 51 and 52. When the signal noise level is low or high the signal on connection 59 is high and low respectively. The $+1$, 0, $-1$ values are coupled to adder 55 on bus 58. The least significant bit of these values is supplied from AND gate 52. The remaining bits are supplied by AND gate 50 and all have the same value. Assuming that the signal samples are processed in two's complement form a negative one is represented by all "ones", a positive one is represented by a "one" least significant bit and all zeroes in the more significant bit positions and a zero value is represented by all zeroes.

The control signal on connection 59 is applied to respective inputs of AND gates 50 and 51. If the noise level is high, the signal on connection 59 is low and both AND gates 50 and 51 produce zero outputs producing all zero bits on bus 58. Alternatively if the noise level is low and the control signal on connection 59 is high the output of AND gate 50 will be controlled by the sign bit of the sample differences which is connected to its second input. If the sample difference is negative its sign bit is a one value and AND gate 50 will develop all ones on the more significant bit lines of bus 58. If the sample difference is positive, its sign bit is a zero value and AND gate 50 will produce all zeroes on the more significant bit lines of bus 58.

AND gate 52 and consequently the least significant bit of bus 58 is determined by the output of OR gate 51 when the control signal is high. All of the bits of the difference samples are applied to respective inputs of the OR gate 51. If any one of the sample bits, including the sign bit, is non zero, indicating a non zero sample differnece, OR gate 51 produces a one value at its output which in turn conditions AND gate 52 to produce a one on the least significant bit of bus 58.

The bus 58 will have all zero bit values for the condition that the control signal is low or for the condition that the control signal is high and all of the bits, including the sign bit, of the difference same are zero.

Elements 24 and 26 are added and coupled with recursive filter 21 in order to process composite video to produce a noise reduced luminance component with complete cancellation of the chrominance component. To accomplish this, the chrominance component $V_{CY}$ must be made to converge to a steady state value in the first frame of no motion. If this condition is obtained, a portion of the input chrominance component can be subtracted from $V_Y$ or $V_{DY}$ to completely cancel the chrominance component therein. Causing the chrominance component to converge in the first frame after motion may be achieved if three values for $K_m$ are applied which correspond to "one" for motion, $1/(2-K_m)$ the first frame of no motion, and $K_m$ for successive frame periods of no motion. With this sequence of scale factors $K_m$, the chrominance component, $V_{CY}$ converges to $K_m/(2-K_m)$ times the input chrominance component value in the first frame of no motion.

Noise reduced luminance, with the chrominance component cancelled, is available at the output port of adder 26. Samples from delay element 22 are coupled via compensation delay element 23 to one input port of adder 26. Scaled sample differences from scaling circuit 24 are coupled to a second input port of adder 26. Sample differences from subtracter 12 are applied to the input of scaling circuit 24.

Output samples, $V_o$, from the adder 26 are expressed by the equation $$V_o = K_o(V_x - V_{DY}) + V_{DY} \quad (3)$$

where $K_o$ is the scale factor applied to the scaling circuit 24. The values of the scale factor $K_o$ are "one" during interframe image motion, "one-half" for the first frame of no motion, and $K_m/2$ for succeeding frames. Rearranging equation (3) and solving for the luminance component $V_{LO}$ and the chrominanc $V_{CO}$ $$V_{LO} = K_o V_{LX} + (1-K_o) V_{LD} \quad (4)$$

$$V_{CO} = K_o V_{CX} + (1-K_o) V_{CDY} \quad (5)$$

From equations (4) and (5) for $K_o$ equal to "one" i.e. during motion periods, $V_{LO}$ and $V_{CO}$ are equal to $V_{LX}$ and $V_{CX}$ respectively. Thus, alternate means must be provided to separate luminance and chrominance during motion intervals. An example of such alternate means may be a low-pass filter connected in parallel with the recursive filter, which is switched into the circuit when motion is detected.

In the first frame of no motion, $K_o$ is set to one-half. The samples $V_{DY}$ correspond to the unaltered composite video of the previous frame. Since there is no motion the luminance component of signal, $V_{DY}$, is correlated with the luminance component of the incomming samples, but the chrominance component is shifted 180 degrees in phase. Under these conditions, and with the scale factor $K_o$ equal to one-half, the luminance and chrominance components from equations (4) and (5) are $$V_{LO} = 1/2 V_{LX} + (1-\tfrac{1}{2}) V_{LX} = V_{LX} \quad (6)$$

$$V_{CO} = 1/2 V_{CX} + (1-\tfrac{1}{2})(-V_{CX}) = 0 \quad (7)$$

which indicates that the chrominance component is completely cancelled during this frame. For this inverval the system has functioned as a frame comb filter with a luminance output. Note that during this frame the chrominance component $V_{CY}$ is equal to $V_{CX} K_m/(2-K_m)$. These values will be the values $V_{CDY}$ during the next frame period and succeeding frame periods in which there is no interframe image motion.

In the second and all succeeding frame periods in which there is no motion the scale factor $K_o$ is set equal to $K_m/62$. Substituting this value for $K_o$ in equations (4) and (5) and solving $$V_{LO} = (K_m/2) V_{LX} + (1-K_m/2) V_{LX} = V_{LX} \quad (8)$$

$$V_{CO} = (K_m/2) V_{CX} + (1-K_m/2)(-V_{CX} K_m/(2-K_m)) = 0 \quad (9)$$

indicating that for all non motion frames the chrominance component is cancelled.

For the above system the motion adaptive circuit 31 provides the scale factors to scaling circuits 16 and 24. However, each set of scale factors will contain only three values as indicated in Table III.

TABLE III

| MOTION SIGNAL | DELAYED MOTION SIGNAL | $K_o$ | $K_m$ |
|---|---|---|---|
| 0 | 0 | $K_{mi}/2$ | $K_{mi}$ |
| 0 | 1 | ½ | $1/(2 - K_{mi})$ |
| 1 | 0 | 1 | 1 |
| 1 | 1 | 1 | 1 |

The value $K_{mi}$ is variable according to the noise content of the input signal at 10.

The scale factor $1/(2-K_m)$ places a constraint on scaling circuit 16. If the steady state scale factor $K_m$ is chosen so that a bit-shift and truncate type of scaling circuit may be employed for element 16, it will not be possible to realize the scale factor $1/(2-K_m)$ with the same scaling circuit.

The scaling circuit 16'' shown in FIG. 5 is a variation of the FIG. 3 circuit with additional elements 90, 91 and 92 to provide scaling by reciprocal binary multiples and by a scale factor which approximates the factor $1/(2-K_m)$. In FIG. 5 elements designated with like numbers as elements of FIG. 3, are the same or equivalent elements.

During intervals that the scaling circuit 16'' is conditioned to scale input samples by "1" or the reciprocal of a binary multiple, elements 53, 54, 56 and 57 in FIG. 5 operate as described with reference to FIG. 3. Gate 91 is disabled effectively disconnecting elements 90 and 91 from the circuitry. The output of the scaling circuit which corresponds to the output of adder 92 is equal in value to the output of bit-shift and truncate circuit 54.

When it is desired to scale by the factor $1/(2-K_m)$, the gate 91 is conditioned by the motion/noise adaptive circuit 31 to couple the divide-by-two circuit, 90, between the adder 92 and the input bus 15. Concurrently, the elements 53, 54, 56 and 57 are programmed by circuitry 31 to scale the input samples by $K_m/4$. When so programmed, the composite scale factor of circuit 16'' is $(1/2+K_m/4)$. For $K_m$ equal to $2^{-N}$ with N equal to 2, 3, 4 and 5, the maximum error of the composite scale factor with respect to the scale factor $1/(2-K_m)$ is 1.6 percent. And it can be shown that the FIG. 5 scaling circuit will cause the chrominance component $V_{CY}$ to converge in approximately five frame periods. The maximum amplitude of the chrominance component contaminating the luminance signal output from adder 26 is about 6 percent of the input chrominance amplitude and this occurs for only one frame period and then rapdily decreases.

Scaling circuit 24 may be realized with e.g., a FIG. 2 type circuit or a FIG. 3 type circuit. The FIG. 3 circuit is applicable even if there is no subsequent circuitry to average the output samples from elements 24 and 26 if the signal will be used to create a display on a kinescope. In this instance, the persistence of the kinescope phosphor coupled with the relatively slow response time of the human eye tend to perform the integration or averaging.

Figure 6:
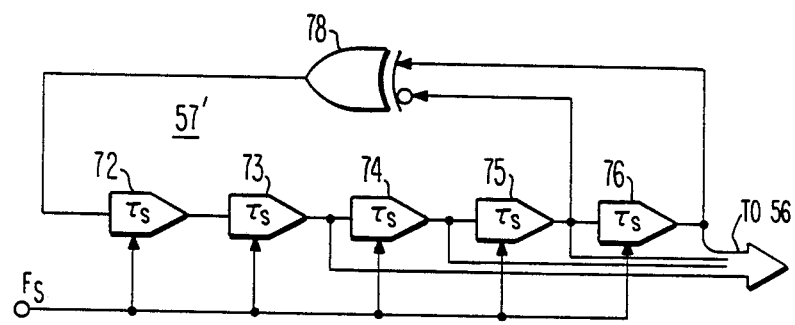
FIG. 6 is a logic diagram of a dither generating circuit for use in the FIG. 3 circuit.

FIG. 6 is a psuedorandom number generator 57' which may be substituted for the dither generator 57 of FIG. 2. The random number generator 57' is of conventional design and consists of the cascade connection of five one sample period delay stages 72-76. The delay stages 72-76 are clocked synchronously at the input sample rate $f_s$ by clocking signal $F_s$. The input to the first delay stage is derived from the output connection of delay stages 75 and 76 via exclusive OR gate 78. The circle on the exclusive OR gate input connection coupled to the output of stage 75 indicates that this input is an inverting input. The feed back connection conditions the outputs of all five delay stages 72-76, taken in parallel, to successively sequence through the five-bit binary numbers corresponding to 0-31 (decimal). The sequence is not monatonic but rather tends to be random. The output, 56, from generator 57' is a sequence of parallel four-bit values derived from the output connection of the last four delay stages 73-76. Since the output 56 consists of four bit values of the random sequence 0-31, it tends to be a random sequence of the numbers 0-15 (decimal). The random number generator 57' is exemplary of a large number of such circuits which may be utilized for the purpose of developing psuedorandom numbers in a given range.

What is claimed is:

1. Scaling circuitry for scaling pulse code modulated (PCM) signal samples comprising:
   a signal input port for applying said PCM signal samples;
   shift and truncating circuitry, having an input port and having an output port, said shift and truncating circuitry for shifting the bit significance of samples applied to its input to produce bit-shifted samples and truncating the bit-shifted samples to effect a scaling of samples applied to its input by $2^{-N}$ where N is an integer, the bit-shifted and truncated samples corresponding to input samples scaled by a factor of $2^{-N}$;
   an adder having a first input and an output terminal respectively coupled to said signal input port and the input port of said shift and truncating circuitry, and having a second input port; and
   means coupled to the second input port of said adder for applying compensating values to offset rounding errors generated by truncating said bit-shifted samples.

2. The scaling circuit set forth in claim 1 wherein the means coupled to the second input port of said adder is a source of values of magnitude $2^{N-1}$.

3. The scaling circuit set forth in claim 2 further including:
   means, having an input port coupled to said signal input port, and having an output port, said means for dividing applied samples by a factor of two; and
   means for combining samples from the output port of said shift and truncating circuit and said means for dividing applied samples by a factor of two, to generate samples at the output port thereof scaled by a factor of $(½+2^{-(N+2)})$.

4. The scaling circuit set forth in claim 1 further including:
   means coupled to said signal input port and the output port of said shift and truncating circuit for incrementing samples provided at the output port of said shift and truncating circuit by one unit for positive PCM input samples, and decrementing samples provided at the output port of said shift and truncating circuit by one unit for negative PCM input samples.

5. The scaling circuit set forth in claim 1 wherein the means for applying compensating values comprises:
   apparatus for generating a sequence of different compensating values synchronous with said PCM signal samples, the time average of the different values of said sequence being substantially equal to the value $(2^{N-1}-0.5)$.

6. The scaling circuit set forth in claim 5 wherein said apparatus for generating a sequence of different values comprises a psuedorandom number generator.

7. The scaling circuit set forth in claim 1 wherein the means for applying compensating values includes a dither generator.

8. The scaling circuit set forth in claim 7 wherein said dither generator comprises:
   a psuedorandom number generator for developing sequences of R-bit numbers; and
   a scaling circuit coupled to psuedorandom number generator for scaling said R-bit numbers by a factor $2^{N-R}$ and for applying the scaled R-bit numbers to the second input port of said adder.

9. The scaling circuit set forth in claim 8 further including:
   means, having an input port coupled to said signal input port, and having an output port, said means for dividing applied samples by a factor of two; and
   means for selectively combining samples from the output port of said shift and truncating circuit and said means for dividing applied samples by a factor of two, to generate samples at the output port thereof scaled by a factor of $(\frac{1}{2}+2^{-(N+2)})$.

10. The scaling circuit set forth in claim 1 including:
    a source of predetermined control signals corresponding to different values N; and
    means responsive to said PCM signal samples for selectively applying said control signal to said shift and truncating circuit to establish the scale factor $2^{-N}$.

* * * * *